US008667437B2

(12) United States Patent
Raje et al.

(10) Patent No.: US 8,667,437 B2
(45) Date of Patent: Mar. 4, 2014

(54) CREATING A STANDARD CELL CIRCUIT DESIGN FROM A PROGRAMMABLE LOGIC DEVICE CIRCUIT DESIGN

(75) Inventors: Salil Ravindra Raje, Saratoga, CA (US); Dinesh D. Gaitonde, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 1141 days.

(21) Appl. No.: 12/049,676

(22) Filed: Mar. 17, 2008

(65) Prior Publication Data

US 2009/0235222 A1      Sep. 17, 2009

(51) Int. Cl.
*G06F 17/50*      (2006.01)

(52) U.S. Cl.
USPC ............ 716/104; 716/103; 716/113; 716/119

(58) Field of Classification Search
USPC .......................................................... 716/104
See application file for complete search history.

(56) References Cited

U.S. PATENT DOCUMENTS

| 5,526,278 | A  | * | 6/1996  | Powell ............................. 716/55 |
| 5,896,299 | A  |   | 4/1999  | Ginetti et al. |
| 6,640,330 | B1 | * | 10/2003 | Joshi .............................. 716/108 |
| 2003/0051106 | A1 |   | 3/2003  | Yen et al. |
| 2006/0225008 | A1 | * | 10/2006 | Schleicher et al. ................ 716/3 |
| 2007/0103192 | A1 | * | 5/2007  | Madurawe ....................... 326/39 |
| 2010/0169856 | A1 | * | 7/2010  | Hom et al. ......................... 716/6 |

OTHER PUBLICATIONS

Kozminski, Krzysztof, "OASIS Application to Re-Synthesis of FPGA Designs as Standard Cell ASICs," *Proc. of the 24th Southeastern Symposium on System Theory and The 3rd Annual Symposium on Communications, Signal Processing Expert Systems, and ASIC VLSI Design*, Mar. 1-3, 1992, pp. 142-144, Greensboro, North Carolina, USA.

Markovic, P. et al., "FPGA to ASIC Conversion Design Methodology with the Support for Fast Retargetting to Different CMOS Implementation Technologies" *Proc. of the 22nd International Conference on Microelectronics (MIEL 2000)* May 14-17, 2000, pp. 703-706, Niš, Serbia.

Mehendale, Mahesh, "A System for Behavior Extraction from FPGA Implementations of Synchronous Designs," Jan. 4-7, 1999, pp. 320-321, Bangalore, India.

Note, Jean-Baptiste et al., "From the bitstream to the netlist," *Proc. of the 16th International ACM/SIGDA Symposium on Field Programmable Gate Arrays*, Feb. 25, 2008, pp. 264-271, Monterey, California, USA.

(Continued)

*Primary Examiner* — Jack Chiang
*Assistant Examiner* — Eric Lee
(74) *Attorney, Agent, or Firm* — Kevin T. Cuenot; LeRoy D. Maunu; Lois D. Cartier

(57) ABSTRACT

A computer-implemented method of converting a circuit design for a programmable logic device (PLD) to a standard cell circuit design can include unmapping a PLD circuit design to a gate level netlist, mapping logic gates of the netlist to functionally equivalent standard cells, and including the standard cells within the standard cell circuit design. Design constraints for the standard cell circuit design can be automatically generated. The design constraints for the standard cell circuit design can be output.

20 Claims, 1 Drawing Sheet

(56) References Cited

OTHER PUBLICATIONS

O'Connor, James T., "A Methodology for Programmable Logic Migration to ASIC's Including Automatic Scan Chain Insertion and ATPG," *Proc. of the 4th Annual IEEE International ASIC Conference and Exhibit*, Sep. 23-27, 1991, pp. P2-1.1 to P2-1.4, Rochester, New York, USA.

Berto, S. et al., "Potentials and Pitfalls of FPGA Application in Inverter Drives—a Case Study," *Proc. of the 2003 IEEE International Conference and Industrial Technology*, Dec. 10, 2003, pp. 500-505, vol. 1, IEEE, Piscataway, New Jersey, USA.

Fung, Ryan et al., "Simultaneous Short-Path and Long-Path Timing Optimization for FPGAs," *Proc. of the 2004 IEEE/ACM International Conference on Computer Aided Design*, Nov. 7, 2004, pp. 838-845, IEEE, Piscataway, New Jersey, USA.

Harris, David et al., "Timing Analysis Including Clock Skew," *IEEE Transactions on Computer-Aided.Design of Integrated Circuits and Systems*, Nov. 1999, pp. 1608-1618, vol. 18, No. 11, IEEE, Piscataway, New Jersey, USA.

\* cited by examiner

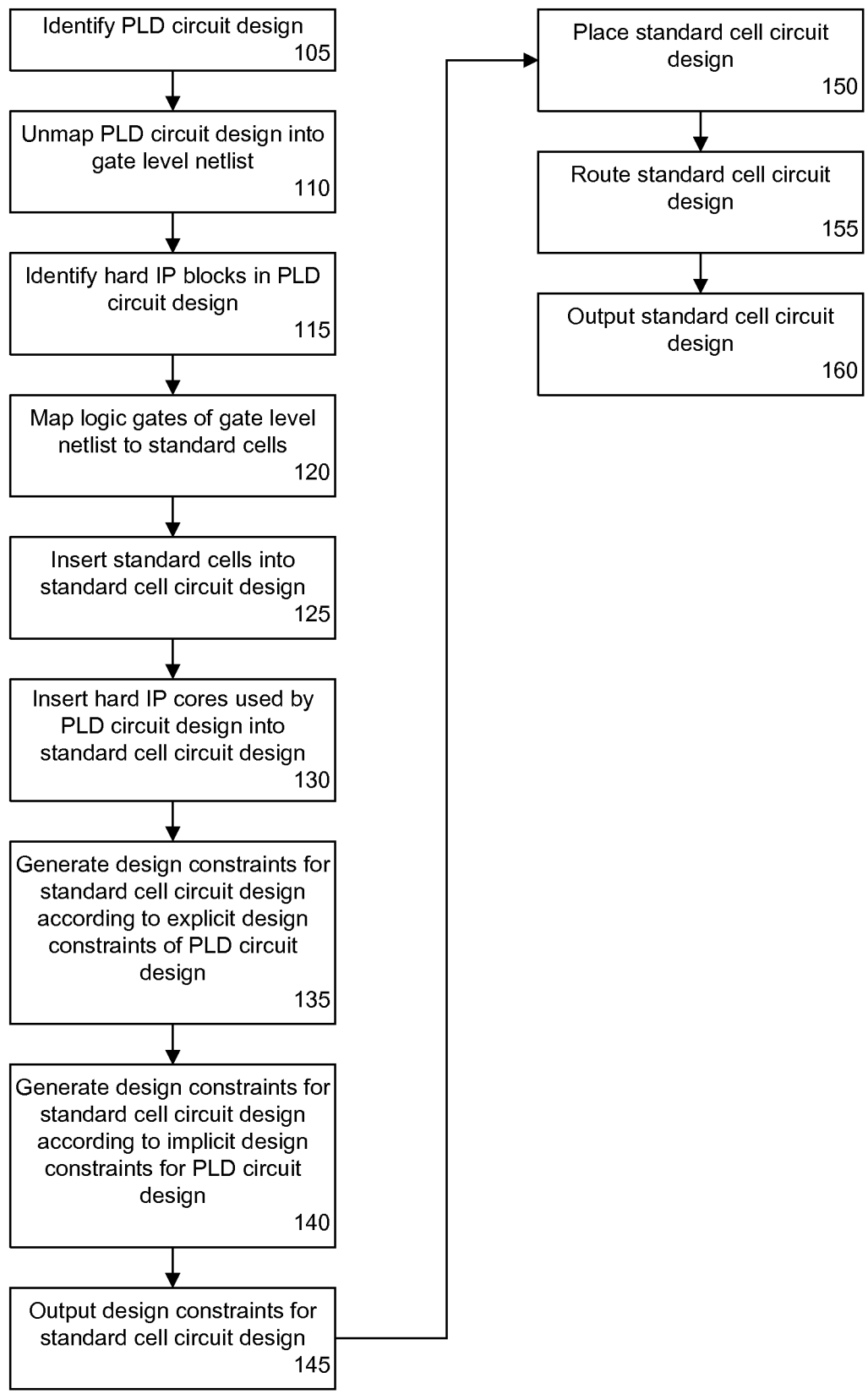

CREATING A STANDARD CELL CIRCUIT DESIGN FROM A PROGRAMMABLE LOGIC DEVICE CIRCUIT DESIGN

FIELD OF THE INVENTION

The embodiments disclosed herein relate to integrated circuit devices (ICs). More particularly, the embodiments relate to creating a standard cell circuit design from a programmable logic device circuit design.

BACKGROUND OF THE INVENTION

Custom circuit designs are often prototyped within programmable logic devices (PLDs). One common type of PLD within which many circuit designs are prototyped is the field programmable gate array (FPGA). The high level of programmability offered by PLDs makes such devices well suited to development efforts. Generally, PLDs are a more costly option for implementing a circuit design once efforts move from development to production. Often, a standard cell implementation of the circuit design, e.g., an application specific integrated circuit (ASIC) implementation, is more cost effective in production than using a PLD.

To reduce costs, circuit designs initially developed using a PLD can be converted into standard cell circuit designs or structured standard cell circuit designs. The conversion process, however, involves several manual steps and can introduce errors into the resulting standard cell circuit design. For example, hard intellectual property (IP) cores available on the PLD, which are used by the PLD circuit design, are not available as standard cells. These cores typically are protected and unavailable to third parties. As such, replacement or alternate IP blocks must be manually selected for use in the standard cell circuit design.

In addition, the conversion process typically begins with a register transfer level (RTL) description of the PLD circuit design. The RTL circuit description is a high level circuit description that is above a gate-level description of the circuit design. The high level RTL description of the PLD circuit design undergoes the entire synthesis process using available timing constraints. The nature of some PLDs, e.g., FPGAs, is that many signal paths are not constrained. Unless manually or explicitly specified, the high level RTL is synthesized without timing requirements for such signal paths. In consequence, the standard cell circuit design may have significantly different timing characteristics than the PLD circuit design from which it was generated.

SUMMARY OF THE INVENTION

The embodiments disclosed herein relate to an automated technique for creating a standard cell circuit design from a programmable logic device (PLD) circuit design. One embodiment of the present invention can include a computer-implemented method of converting a circuit design for a PLD to a standard cell circuit design. The method can include unmapping a PLD circuit design to a gate level netlist, mapping logic gates of the netlist to functionally equivalent standard cells, and including the standard cells within the standard cell circuit design. Design constraints for the standard cell circuit design can be automatically generated according to the PLD circuit design. The design constraints for the standard cell circuit design can be output.

The computer-implemented method can include placing and routing the standard cell circuit design according to the design constraints for the standard cell circuit design and outputting the standard cell circuit design. In one embodiment, the PLD circuit design can be specified as a bitstream or in another binary form.

Unmapping the PLD circuit design can include decomposing look-up tables (LUTs) into logic gates. The computer-implemented method further can include inserting, into the standard cell circuit design, each hard intellectual property (IP) block used by the PLD circuit design.

Generating design constraints for the standard cell circuit design can include extracting signal path delays from the PLD circuit design and setting each signal path delay as a maximum signal path delay for a corresponding signal path of the standard cell circuit design. Generating design constraints for the standard cell circuit design also can include identifying explicit timing constraints of the PLD circuit design and translating the explicit timing constraints from a format used by the PLD circuit design to a format used by the standard cell circuit design.

Generating design constraints for the standard cell circuit design can include, for a selected clock domain of the standard cell circuit design, setting a hold time constraint according to a signal path having a shortest delay between a timing start point and a timing end point within a clock domain of the PLD circuit design that corresponds to the selected clock domain.

The PLD circuit design can include a first clock domain and a second clock domain. The standard cell circuit design can include a first clock domain corresponding to the first clock domain of the PLD circuit design and a second clock domain corresponding to the second clock domain of the PLD circuit design. Accordingly, generating design constraints further can include setting a hold time constraint for a signal beginning at a timing start point within the first clock domain and ending at a timing end point within the second clock domain of the standard cell circuit design according to a signal path having a shortest delay of signals having a timing start point in the first clock domain and having a timing end point in the second clock domain of the PLD circuit design.

Generating design constraints also can include identifying pins of a target PLD that are used by the PLD circuit design and constraining the standard cell circuit design to include only pins corresponding to pins of the target PLD that are used by the PLD circuit design. Unused pins of the target PLD are not implemented within the standard cell circuit design. Pin placement of the standard cell circuit design also can be constrained to match pin placement of the PLD circuit design.

Another embodiment of the present invention can include a computer-implemented method of converting a circuit design for a PLD to a standard cell circuit design. The method can include determining a gate level netlist from a binary representation of a circuit design for a PLD, mapping logic gates of the netlist to standard cells, including the standard cells within the standard cell circuit design, and inserting each hard IP block used by the PLD circuit design into the standard cell circuit design. Timing constraints for the standard cell circuit design can be generated according to timing information extracted for the PLD circuit design. The standard cell circuit design can be placed and routed according to the timing constraints for the standard cell circuit design. The standard cell circuit design can be output.

Generating timing constraints for the standard cell circuit design can include using input/output (I/O) signal path delays of the PLD circuit design as maximum signal path delays for corresponding signal paths of the standard cell circuit design and translating non-I/O signal path delays of the circuit design for the PLD from a first format to a second format used by the standard cell circuit design.

Generating timing constraints for the standard cell circuit design can include, for a clock domain of the standard cell circuit design, setting a hold time constraint according to a signal path having a shortest delay between a timing start point and a timing end point within a corresponding clock domain of the PLD circuit design.

In one aspect, the PLD circuit design can include a first clock domain and a second clock domain. The standard cell circuit design can include a first clock domain corresponding to the first clock domain of the PLD circuit design and a second clock domain corresponding to the second clock domain of the PLD circuit design. Accordingly, generating design constraints further can include setting a hold time constraint for a signal beginning at a timing start point within the first clock domain and ending at a timing end point within the second clock domain of the standard cell circuit design according to a signal path having a shortest delay of signals having a timing start point in the first clock domain and having a timing end point in the second clock domain of the PLD circuit design.

The computer-implemented method can include identifying pins of a target PLD that are used by the PLD circuit design and constraining the standard cell circuit design to include only pins corresponding to pins of the target PLD that are used by the PLD circuit design. Unused pins of the target PLD are not implemented within the standard cell circuit design. Pin placement of the standard cell circuit design can be constrained to match pin placement of the PLD circuit design.

Yet another embodiment of the present invention can include a computer program product including a computer-usable medium having computer-usable program code that, when executed by a data processing system, causes the data processing system to perform the various steps and/or functions disclosed herein.

BRIEF DESCRIPTION OF THE DRAWINGS

FIG. 1 is a flow chart illustrating a method of transforming a circuit design for a programmable logic device into a standard cell circuit design in accordance with one embodiment of the present invention.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to automatically creating a circuit design using standard cells from a circuit design for a programmable logic device (PLD). In accordance with the inventive arrangements disclosed herein, a PLD circuit design can be converted into a standard cell circuit design such as an application specific integrated circuit (ASIC). Rather than taking a behavioral description of the PLD circuit design, such as a high level register transfer level (RTL) circuit description, and processing the behavioral description through a standard cell-based implementation flow, information can be extracted from the implementation file(s) of the PLD circuit design. This information can be applied to the standard cell circuit design.

It is noted here that the term "standard cell" is often, though not exclusively, used herein to refer to elements of an integrated circuit device that are formed in hardware during device fabrication. A PLD circuit is a circuit that is formed by configuring and loading specific bitstreams into registers in a programmable logic device PLD. A PLD circuit can exist as sequence of configuration bits in a configuration memory, as a fully configured programmable logic device, or solely as a simulation in a simulation computer.

Circuit components of the PLD circuit design can be decomposed into constituent logic gates and mapped to standard cells of a standard cell library. Information relating to pin configuration, timing, and other aspects of the PLD circuit design can be extracted and used to generate design constraints for the standard cell circuit design. The standard cell circuit design can be placed and routed utilizing the design constraints generated from the information extracted from the PLD circuit design.

The FIGURE presents a flow chart illustrating a computer-implemented method of converting a circuit design for a PLD into a standard cell circuit design in accordance with one embodiment of the present invention. The method illustrated in the FIGURE can be implemented using any of a variety of computer-based electronic design automation (EDA) tools for developing circuit designs for implementation within PLDs or as standard cell circuit designs, e.g., as ASICs. The embodiments disclosed herein can be implemented by a data processing system executing suitable operational software, e.g., one or more EDA tools.

In step 105, a PLD circuit design that is to be converted into a standard cell circuit design can be identified. The PLD circuit design can specify complete placement and routing information. For example, in one embodiment, the PLD circuit design can be specified as a post synthesis netlist which includes physical placement information. In another embodiment, the PLD circuit design can be specified in binary format, e.g., a format that is not readable by a human being. For example, the PLD circuit design can be a bitstream that, when loaded into a target PLD, configures the PLD to implement or instantiate the circuit design.

In another example, the PLD circuit design can be one or more implementation files specifying complete placement and routing information that may be translated or further processed into a bitstream. In the case of a circuit design to be implemented within a target FPGA of the type available from Xilinx, Inc. of San Jose, Calif., the PLD circuit design can be a Native Circuit Description (NCD) file. An NCD file represents the physical circuit description of the design as it applies to a specific target device. An NCD file can specify complete placement and routing information and may be translated into a bitstream.

In step 110, the PLD circuit design, e.g., the binary files specifying the PLD circuit design, can be unmapped into a gate level netlist. In unmapping the PLD circuit design, various tasks can be performed. One task is that logic blocks can be decomposed into logic gates. The logical expression implemented by each logic block, whether a complex logic block or a single LUT, can be unmapped, or decomposed, into a group of one or more constituent logic gates. As used herein, the phrase "complex logic block" can refer to a portion of the circuit design that is implemented using a plurality of programmable circuit elements, e.g., LUTs and flip-flops. Examples of complex logic blocks can include carry chains or distributed random access memories. When taken collectively, the group of logic gate(s) can implement the same logical expression, or functionality, as the decomposed logic block. It should be appreciated that in decomposing each logic block, the connectivity of the resulting logic gates can be specified such that the functionality of the group of logic gates is the same as the decomposed logic block, whether a single LUT or a complex logic block, from which the group of logic gates was derived.

Another task is that logic blocks can be identified and tracked. An association between each logic block and the logic gates into which the logic block is decomposed can be created. Accordingly, a group of one or more logic gates, into which a complex logic block has been decomposed, can be annotated or otherwise identified as implementing a particular function, e.g., as a carry chain. The annotation or description associated with the logic gates can be used to map such logic gates to a suitable standard cell.

As is known, a standard cell library can include standardized, programmatic descriptions of circuit components such as AND gates, OR gates, inverters, multiplexers, and the like. Each programmatic description of a circuit structure or component, whether simple or complex, can be referred to as a "standard cell." When incorporated into a circuit design and subjected to an implementation flow, e.g., synthesis, mapping, placement, and routing, the standard cell instantiates the specified hardware within the target device.

It should be appreciated that by decomposing structures such as LUTs and complex logic blocks into constituent logic gates, the size of the circuit design can be reduced from that used within the PLD circuit implementation. More particularly, the physical area needed to implement the circuit design using an ASIC, as compared to a PLD, can be reduced. Such is the case as the circuitry traditionally incorporated into the logic blocks, e.g., LUTs and/or complex logic blocks, to achieve programmability in the PLD is no longer needed and, therefore, can be excluded from the standard cell implementation.

In step 115, hard intellectual property (IP) blocks utilized by the PLD circuit design can be identified. A hard IP block can refer to a portion of the PLD circuit design that utilizes specialized hardware within the target PLD, e.g., within the physical PLD. Examples of hard IP blocks can include, for example, digital signal processing blocks, block random access memories, processors, input/output (I/O) blocks, or the like. The hard IP blocks identified within the PLD circuit design are not decomposed as is the case with logic blocks composed of LUTs, flip-flops, and other varieties of programmable logic. Rather, hard IP blocks available in the target PLD that are utilized by the PLD circuit design can be incorporated within the standard cell circuit design directly or in modified form as will be described herein in further detail.

In step 120, the logic gates specified by the gate level netlist can be mapped to standard cells of a standard cell library. The logic gates of the gate level netlist can be matched to standard cell versions of each respective logic gate selected from the standard cell library. For example, logical OR gates can be mapped to logical OR gate standard cells. More complex logic blocks can be mapped to more complex standard cells, e.g., a carry chain of the PLD to a carry chain of the standard cell library. It should be appreciated that when a one-to-one mapping for a given circuit structure of the PLD does not exist, that structure may be decomposed, or further decomposed as the case may be, into its constituent parts for purposes of mapping the individual parts to one or more available standard cells. For example, a carry chain may be mapped to a plurality of standard cell versions of the constituent logic gates that implement the carry chain within the PLD circuit design.

In mapping the logic gate netlist to standard cells, flip-flop logic gates of the PLD circuit design can be converted to scan flip-flop standard cells within the standard cell circuit design. As is known, a scan flip-flop can operate in a normal mode or a test mode. Typically, a scan flip-flop is implemented as a flip-flop that includes a multiplexer or other switching mechanism. When placed in test mode, the scan flip-flop can behave as a serial shift register. When connected with other scan flip-flops via a scan chain, a test mode can be realized where the scan flip-flops become a single, large shift register. In test mode, data can be clocked serially through all the scan flip-flops and out of an output pin at the same time as new data is clocked in from an input pin.

In step 125, the standard cells can be included or inserted into the standard cell circuit design. That is, each standard cell to which a portion of the PLD circuit design has been mapped can be inserted or included within the standard cell circuit design.

In step 130, the hard IP blocks used by the PLD circuit design can be included or instantiated within the standard cell circuit design. In one embodiment, the hard IP blocks of the PLD circuit design can be implemented as implemented within the PLD circuit design. That is, the hard IP blocks can be incorporated directly into the standard cell circuit design. In another embodiment, only those portions of a hard IP block that are used in the PLD circuit design are implemented within the standard cell circuit design. Portions of the hard IP block that implement functionality that is not utilized can be excluded. Any hard IP blocks available in the target PLD that are not used by the PLD circuit design can be excluded from the standard cell circuit design as well.

In another embodiment, a wrapper can be included for one or more or each hard IP block. The wrapper is code, e.g., RTL level code, that implements testing circuitry that is not necessary within a PLD. For example, within a PLD, the programmable fabric of the PLD can be reconfigured to test the hard IP block. When implemented within a standard cell circuit design, however, that functionality is not built into the device. Accordingly, a wrapper can be added to one or more or each hard IP block that implements or instantiates testing circuitry for use with the hard IP block.

It should be appreciated that the connectivity specified in the standard cell circuit design can be the same as, or derived from, the connectivity of the PLD circuit design. For example, communication between logic gates, hard IP blocks, and the like within the PLD circuit design can be unchanged with respect to the standard cells, hard IP blocks, etc. within the standard cell circuit design.

In step 135, design constraints for the standard cell circuit design can be generated according to explicitly defined design constraints for the PLD circuit design. Explicitly defined design constraints for the PLD circuit design can be translated into design constraints that are usable by a standard cell circuit design implementation flow. Explicit design constraints can be specified, for example, within a file having a UCF extension, which stands for Uniform Constraints File (UCF). A UCF file is an ASCII file specifying constraints on a PLD circuit design for an FPGA of the variety available from Xilinx, Inc.

Explicit design constraints can include any of a variety of different types of constraints. One type of explicit design constraint can include a pin placement and/or packaging constraint. For example, a design constraint can be generated for the standard cell circuit design that states that the same packaging or package used by the target PLD is to be selected and used for the standard cell circuit design.

I/O pins of the target PLD that are utilized by the PLD circuit design can be identified as well as any unused I/O pins. Design constraints can be created for the standard cell circuit design that ensure that the same I/O pin configuration, with respect to used I/O pins of the target PLD, will exist for the standard cell circuit design. That is, each physical I/O pin of the target PLD used by the PLD circuit design will have a corresponding physical I/O pin on the standard cell circuit design at a same relative location. The resulting standard cell circuit design will fit the same socket of a circuit board as the target PLD without any change to the routing or layout of the circuit board upon which the socket is mounted. In this sense, the pin configuration or pin placement of the PLD circuit design and the standard cell circuit design can be said to "match" or be equivalent.

Another set of explicit design constraints that can be generated can include timing constraints. Explicit timing constraints can include, for example, I/O related timing constraints. I/O related timing constraints must be explicitly defined by a designer as timing information relating to a system external to the circuit design is not knowable from an analysis of the PLD circuit design itself. Any timing constraints that are non-I/O related, but explicitly specified by a designer with respect to the PLD circuit design or specified for a standard cell circuit design, if available, can be translated into a format that is usable within an implementation flow for the standard cell circuit design. For example, any explicit constraints originally specified within a UCF can be translated into a format compatible with, and specified as, an SDC or other file type that is usable by EDA tools capable of performing all or a part of an implementation flow for a standard cell circuit design. In one embodiment, such explicit timing constraints, e.g., any user or designer specified timing constraint or requirement, can be specified as a minimum signal path constraint for the standard cell circuit design.

In step 140, design constraints for the standard cell circuit design can be generated according to implicit design constraints for the PLD circuit design. Implicit design constraints refer to constraints that are not explicitly specified. Implicit design constraints are determined from a review of the implementation information of the PLD circuit design. For example, timing delays for any signal path within the PLD circuit design can be used to create timing constraints for the standard cell circuit design. Though no explicit timing constraint for a given signal path may exist in the UCF file, for example, the delay for that signal path as determined by an EDA tool can be used to create a timing constraint for the same or corresponding signal path when implemented within the standard cell circuit design. As noted, any design constraint generated for the standard cell circuit design can be specified in a format that is usable by an implementation flow for the standard cell circuit design.

In one embodiment, regarding implicit timing constraints, the timing of each signal path within each clock domain can be extracted from the PLD circuit design. For example, each signal path starting from an I/O and continuing to a first register encountered on that signal path from the I/O can be identified, each signal path from an I/O to another I/O through any combinatorial logic can be identified, each signal path from a register to an I/O can be identified, and each signal path from a register to a register can be identified. The timing of such signal paths can be determined from the PLD circuit design. The delays determined from the PLD circuit design can be used as maximum signal path constraints for the same, e.g., corresponding, signal paths implemented within the standard cell circuit design. For example, the timing delay of a selected signal path of the PLD circuit design as determined using a PLD EDA tool can be used as the maximum time constraint for the same signal path when implemented or specified in the standard cell circuit design.

Implicit timing constraints also can be generated within a selected clock domain and across-clock domains. For example, a hold time constraint for the standard cell circuit design can be determined and specified according to a signal path having a shortest delay between a timing start point and a timing end point within a selected clock domain of the PLD circuit design. That is, a signal path with a shortest delay for a selected clock domain within the PLD circuit design can be identified. The delay can be measured from a timing, e.g., a clocked, start point and a timing end point of the signal path so long as the timing start point and the timing end point are within the selected, e.g., same, clock domain. The delay of that signal path can be used as a hold time constraint for each other signal path within the clock domain of the standard cell circuit design that corresponds to, or is the same as, the selected clock domain of the PLD circuit design. Thus, if 10 clock domains exist, there can be 10 hold times, e.g., one hold time for each clock domain.

With respect to cross-clock domains, a first clock domain and a second clock domain of the PLD circuit design can be selected. A signal path that begins at a timing start point in the first clock domain and continues to a timing end point within the second clock domain, and that has a shortest delay of each signal path crossing from the first clock domain to the second clock domain, can be selected from the PLD circuit design. The delay of the selected cross-clock domain signal path can be used as a hold time constraint for each signal path crossing from the first clock domain to the second clock domain as implemented within the standard cell circuit design. That is, the delay of the selected cross-clock domain signal path of the PLD can be used as the hold time constraint for each signal path crossing from the first clock domain to the second clock domain of the standard cell circuit design, where the first and second clock domains of the standard cell circuit design correspond to, or are the same as, the first and second clock domains of the PLD circuit design.

It should be appreciated that the cross-clock domain hold time constraints are directional in nature. That is, if a signal flows from clock domain A into clock domain B, the hold time constraint for signals going from clock domain A to clock domain B will be the same for all such signals, but different for signals going from clock domain B to clock domain A. A different hold time constraint can be determined for the group of signals going from clock domain B to clock domain A in the similar or same manner as described.

Another example of an implicit timing constraint can relate to pin, ball, and/or package related timing constraints. Such timing characteristics should be the same as, or approximately the same as, those of the PLD circuit design. Since, for example, the resulting standard cell circuit design implementation typically has fewer I/O pins than the PLD circuit design implementation, timing can be influenced by effects such as Simultaneous Switching of Outputs (SSO). Since pins of the target PLD that are not used by the PLD circuit design will not be included in the resulting ASIC implementation, the lack of pins can influence timing of the ASIC implementation. For example, certain circuit properties, e.g., capacitance and the like, may vary from the quantities existing in the PLD circuit design implementation to the ASIC as a result of the reduced number of pins. Such changes must be accounted for with regard to placement and/or routing.

In step 145, design constraints generated for the standard cell circuit design can be output. As used herein, "outputting" and/or "output" can mean, for example, writing to a file, storing in memory, whether persistent memory or not, writing to a user display or other output device, playing audible notifications, sending or transmitting to another system, exporting, or the like.

In step 150, the standard cell circuit design can be placed. The standard cell circuit design can be placed using the design constraints specified in step 145. In step 155, the standard cell circuit design can be routed. The standard cell circuit design can be routed using the design constraints output in step 145. Both placement and routing can be performed so that all design constraints of the standard cell circuit design are met. During routing, scan chains can be implemented for the standard cell circuit design. As is known, a scan chain refers to a design for test technique in which scan flip-flops can be linked in a way to form a serial shift register when placed in a testing mode.

In step 160, the standard cell circuit design can be output. The resulting standard cell circuit design can be verified according to the design constraints determined or extracted from the PLD circuit design.

The embodiments disclosed herein provide an automated technique for creating a standard cell circuit design from a PLD circuit design. The embodiments disclosed herein facilitate increased area reduction and eliminate the need for designers or customers to provide RTL files for conversion into a standard cell circuit design.

The flowchart in the FIGURE illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It is noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing system. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

A data processing system, e.g., a computer or computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of converting a programmable logic device (PLD) circuit design to a standard cell circuit design, the method comprising:
   unmapping a physically mapped PLD circuit design to a gate level netlist;
   wherein the unmapping comprises decomposing logic blocks of the circuit design into logic gates, a logic block comprises a single lookup table or a complex logic block, and a complex logic block comprises a plurality of programmable circuit elements of the PLD;

annotating a group of the logic gates, into which at least one logic block has been decomposed, with a description of a particular function implemented by configuration of the programmable circuit elements of the at least one logic block;

mapping, using a processor, logic gates of the netlist to functionally equivalent standard cells;

wherein the mapping includes using the description of the particular function to map the group of logic gates of the at least one logic block to a suitable standard cell that implements the particular function;

including the standard cells within the standard cell circuit design;

automatically generating design constraints for the standard cell circuit design according to the PLD circuit design; and outputting the design constraints for the standard cell circuit design.

2. The method of claim 1, wherein the group of one or more logic gates comprises at least one logic gate from each of at least two different decomposed logic blocks.

3. The method of claim 1, further comprising:
converting a plurality of flip-flop logic gates of the PLD circuit design to scan flip-flop standard cells.

4. The method of claim 1, further comprising inserting, into the standard cell circuit design, each hard intellectual property block used by the PLD circuit design.

5. The method of claim 1, wherein generating design constraints for the standard cell circuit design comprises:
extracting signal path delays from the PLD circuit design; and
setting each signal path delay as a maximum signal path delay for a corresponding signal path of the standard cell circuit design.

6. The method of claim 1, wherein generating design constraints for the standard cell circuit design comprises:
identifying explicit timing constraints of the PLD circuit design; and
translating the explicit timing constraints from a format used by the PLD circuit design to a format used by the standard cell circuit design.

7. The method of claim 1, wherein generating design constraints for the standard cell circuit design comprises, for a selected clock domain of the standard cell circuit design, setting a hold time constraint according to a signal path having a shortest delay between a timing start point and a timing end point within a clock domain of the PLD circuit design that corresponds to the selected clock domain.

8. The method of claim 1, wherein the PLD circuit design comprises a first clock domain and a second clock domain and the standard cell circuit design comprises a first clock domain corresponding to the first clock domain of the PLD circuit design and a second clock domain corresponding to the second clock domain of the PLD circuit design, wherein generating design constraints further comprises setting a hold time constraint for a signal beginning at a timing start point within the first clock domain and ending at a timing end point within the second clock domain of the standard cell circuit design according to a signal path having a shortest delay of signals having a timing start point in the first clock domain and having a timing end point in the second clock domain of the PLD circuit design.

9. The method of claim 1, wherein generating design constraints for the standard cell circuit design comprises:
identifying pins of a target PLD that are used by the PLD circuit design;
constraining the standard cell circuit design to include only pins corresponding to pins of the target PLD that are used by the PLD circuit design, wherein unused pins of the target PLD are not implemented within the standard cell circuit design; and
constraining pin placement of the standard cell circuit design to match pin placement of the PLD circuit design.

10. The method of claim 1, further comprising:
identifying a hard intellectual property (IP) block that is used by the PLD circuit design and that does not include test circuitry for testing the hard IP block; and
inserting into the standard cell circuit design, the hard IP block with test circuitry for testing the hard IP block in the standard cell circuit design.

11. A method of converting a circuit design for a programmable logic device (PLD) to a standard cell circuit design, the method comprising:
determining a gate level netlist from a binary representation of a physically mapped circuit design for a PLD;
wherein the determining comprises decomposing logic blocks of the circuit design into logic gates, a logic block comprises a single lookup table or a complex logic block, and a complex logic block comprises a plurality of programmable circuit elements of the PLD;
annotating a group of the logic gates, into which at least one logic block has been decomposed, with a description of a particular function implemented by configuration of the programmable circuit elements of the at least one logic block;
mapping, using a processor, logic gates of the netlist to standard cells;
wherein the mapping includes using the description of the particular function to map the group of logic gates of the at least one logic block to a suitable standard cell that implements the particular function;
including the standard cells within the standard cell circuit design;
inserting each hard intellectual property block used by the PLD circuit design into the standard cell circuit design;
generating timing constraints for the standard cell circuit design according to timing information extracted from the PLD circuit design;
placing and routing the standard cell circuit design according to the timing constraints for the standard cell circuit design; and
outputting the standard cell circuit design.

12. The method of claim 11, wherein generating timing constraints for the standard cell circuit design comprises:
using input/output signal path delays of the PLD circuit design as maximum signal path delays for corresponding signal paths of the standard cell circuit design; and
translating non-input/output signal path delays of the circuit design for the PLD from a first format to a second format used by the standard cell circuit design.

13. The method of claim 11, wherein generating timing constraints for the standard cell circuit design comprises, for a clock domain of the standard cell circuit design, setting a hold time constraint according to a signal path having a shortest delay between a timing start point and a timing end point within a corresponding clock domain of the PLD circuit design.

14. The method of claim 11, wherein the PLD circuit design comprises a first clock domain and a second clock domain and the standard cell circuit design comprises a first clock domain corresponding to the first clock domain of the PLD circuit design and a second clock domain corresponding to the second clock domain of the PLD circuit design, wherein generating design constraints further comprises setting a hold time constraint for a signal beginning at a timing start point within the first clock domain and ending at a timing end point within the second clock domain of the standard cell circuit design according to a signal path having a shortest delay of signals having a timing start point in the first clock domain and having a timing end point in the second clock domain of the PLD circuit design.

15. The computer-implemented method of claim 11, further comprising:
    identifying pins of a target PLD that are used by the PLD circuit design;
    constraining the standard cell circuit design to include only pins corresponding to pins of the target PLD that are used by the PLD circuit design, wherein unused pins of the target PLD are not implemented within the standard cell circuit design; and
    constraining pin placement of the standard cell circuit design to match pin placement of the PLD circuit design.

16. A computer program product comprising:
    a non-transitory computer-usable medium comprising computer-usable program code that, when executed by a processor, converts a circuit design for a programmable logic device (PLD) to a standard cell circuit design, the computer-usable medium comprising:
    computer-usable program code that unmaps a physically mapped PLD circuit design to a gate level netlist;
    wherein the program code that unmaps comprises program code that decomposes logic blocks of the circuit design into logic gates, and wherein a logic block comprises a single lookup table or a complex logic block, and a complex logic block comprises a plurality of programmable circuit elements of the PLD;
    computer-usable program code that annotates a group of the logic gates, into which at least one logic block has been decomposed, with a description of a particular function implemented by configuration of the programmable circuit elements of the at least one logic block;
    computer-usable program code that maps logic gates of the netlist to functionally equivalent standard cells;
    wherein the program code that maps uses the description of the particular function to map the group of logic gates of the at least one logic block to a suitable standard cell that implements the particular function;
    computer-usable program code that includes the standard cells within the standard cell circuit design;
    computer-usable program code that automatically generates design constraints for the standard cell circuit design according to the PLD circuit design; and
    computer-usable program code that outputs the design constraints for the standard cell circuit design.

17. The computer program product of claim 16, further comprising:
    computer-usable program code that places and routes the standard cell circuit design according to the timing constraints for the standard cell circuit design; and
    computer-usable program code that outputs the standard cell circuit design.

18. The computer program product of claim 17, further comprising:
    computer-usable program code that inserts, into the standard cell circuit design, each hard intellectual property block used by the PLD circuit design;
    computer-usable program code that uses signal path delays of the circuit design for the PLD as maximum signal path delays for corresponding signal paths of the standard cell circuit design; and
    computer-usable program code that translates signal path delays of the circuit design for the PLD from a first format to a second format used by the standard cell circuit design.

19. The computer program product of claim 17, wherein the computer-usable program code that generates design constraints for the standard cell circuit design comprises computer-usable program code that, for a selected clock domain of the standard cell circuit design, sets a hold time constraint according to a signal path having a shortest delay between a timing start point and a timing end point within a clock domain of the PLD circuit design that corresponds to the selected clock domain.

20. The computer program product of claim 17, wherein the PLD circuit design comprises a first clock domain and a second clock domain and the standard cell circuit design comprises a first clock domain corresponding to the first clock domain of the PLD circuit design and a second clock domain corresponding to the second clock domain of the PLD circuit design, wherein the computer-usable program code that generates design constraints further comprises computer-usable program code that sets a hold time constraint for a signal beginning at a timing start point within the first clock domain and ending at a timing end point within the second clock domain of the standard cell circuit design according to a signal path having a shortest delay of signals having a timing start point in the first clock domain and having a timing end point in the second clock domain of the PLD circuit design.

* * * * *